United States Patent
Wei et al.

(10) Patent No.: US 11,915,855 B2
(45) Date of Patent: Feb. 27, 2024

(54) METHOD TO FORM MULTILE ELECTRICAL COMPONENTS AND A SINGLE ELECTRICAL COMPONENT MADE BY THE METHOD

(71) Applicant: CYNTEC CO., LTD., Hsinchu (TW)

(72) Inventors: Chin Hung Wei, Hsinchu (TW); Min Lian Kuo, Hsinchu (TW); Chung Kai Liao, Hsinchu County (TW)

(73) Assignee: CYNTEC CO., LTD., Hsinchu (TW)

( * ) Notice: Subject to any disclaimer, the term of this patent is extended or adjusted under 35 U.S.C. 154(b) by 576 days.

(21) Appl. No.: 16/820,968

(22) Filed: Mar. 17, 2020

(65) Prior Publication Data
US 2020/0303118 A1    Sep. 24, 2020

Related U.S. Application Data

(60) Provisional application No. 62/822,048, filed on Mar. 22, 2019.

(51) Int. Cl.
| | |
|---|---|
| H01F 27/29 | (2006.01) |
| H01F 27/32 | (2006.01) |
| H01F 27/28 | (2006.01) |
| H01F 27/24 | (2006.01) |
| H01F 27/02 | (2006.01) |
| H01F 27/22 | (2006.01) |
| H05K 1/18 | (2006.01) |
| H01L 25/07 | (2006.01) |

(52) U.S. Cl.
CPC ......... *H01F 27/327* (2013.01); *H01F 27/022* (2013.01); *H01F 27/22* (2013.01); *H01F 27/24* (2013.01); *H01F 27/2823* (2013.01); *H01F 27/2852* (2013.01); *H01F 27/29* (2013.01); *H05K 1/18* (2013.01); *H01L 25/072* (2013.01); *H05K 2201/1003* (2013.01); *H05K 2201/10166* (2013.01); *H05K 2201/10515* (2013.01)

(58) Field of Classification Search
CPC ...... H01F 27/327; H01F 27/022; H01F 27/22; H01F 27/24; H01F 27/2823; H01F 27/2852; H01F 27/29; H01F 27/306; H01F 2017/048; H01F 17/04; H01F 27/292; H01F 17/0006; H01F 2017/0066; H01F 3/08
See application file for complete search history.

(56) References Cited

U.S. PATENT DOCUMENTS

| | | | | |
|---|---|---|---|---|
| 8,723,629 | B1 * | 5/2014 | Liu | H01F 27/022 336/212 |
| 2006/0038651 | A1 * | 2/2006 | Mizushima | H01F 17/04 336/83 |
| 2013/0113593 | A1 * | 5/2013 | Jeong | H01F 17/0033 336/200 |
| 2013/0115393 | A1 * | 5/2013 | Beck | D03D 15/573 428/196 |

(Continued)

*Primary Examiner* — Mang Tin Bik Lian
(74) *Attorney, Agent, or Firm* — Min-Lee Teng

(57) ABSTRACT

A method to form a plurality of inductors in a single process by placing multiple coils on a first magnetic sheet, and then stacking magnetic layers on the first magnetic sheet to encapsulate the coils so as to from a large magnetic body, and then cutting the large magnetic body into multiple inductors, wherein a terminal part of the coil disposed on the bottom surface of the magnetic body of the inductor is extended away from the axis of the coil and is entirely located at a same side of the axis of the coil.

11 Claims, 12 Drawing Sheets

(56) References Cited

U.S. PATENT DOCUMENTS

| | | | |
|---|---|---|---|
| 2014/0145814 A1* | 5/2014 | Lee | H01F 17/0013 336/200 |
| 2014/0266541 A1* | 9/2014 | Sakamoto | H01F 27/24 29/606 |
| 2015/0325364 A1* | 11/2015 | Lee | H01F 27/292 29/606 |
| 2016/0012961 A1* | 1/2016 | Suzuki | H01F 27/29 29/602.1 |
| 2016/0012962 A1* | 1/2016 | Lee | H01F 27/292 427/116 |
| 2016/0260535 A1* | 9/2016 | Kubota | H01F 17/0013 |
| 2017/0053739 A1* | 2/2017 | Oki | H01F 41/0246 |
| 2017/0229234 A1* | 8/2017 | Lee | H01F 27/29 |
| 2018/0151285 A1* | 5/2018 | Kwon | H01F 3/08 |
| 2019/0295760 A1* | 9/2019 | Xia | H01F 41/0206 |

* cited by examiner providing a first magnetic sheet, wherein the first magnetic sheet comprising at least one magnetic powder
S101

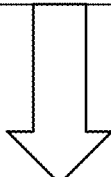

disposing a plurality of coils on the first magnetic sheet, wherein each coil is formed by a corresponding conductive wire
S102

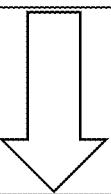

stacking at least one second magnetic layer over the first magnetic sheet for forming a magnetic body encapsulating the plurality of coils
S103

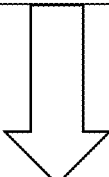

cutting the magnetic body into a plurality of pieces with each piece comprising a corresponding coil encapsulated by a corresponding portion of the magnetic body, wherein a side surface of the terminal part of the conductive wire forming the coil is exposed from said corresponding portion of the magnetic body for forming an electrode of the electrical component
S104

FIG. 1

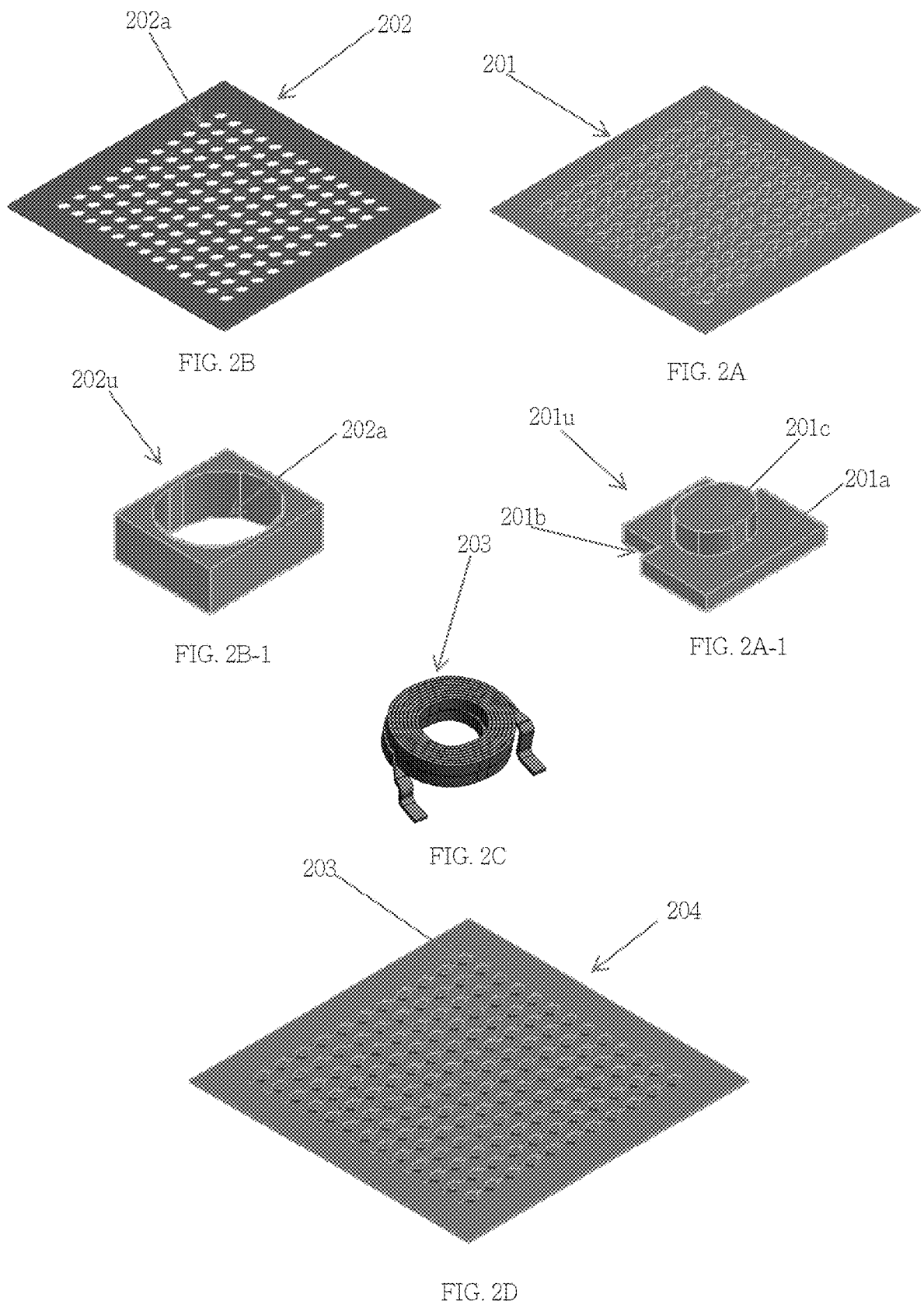

METHOD TO FORM MULTILE ELECTRICAL COMPONENTS AND A SINGLE ELECTRICAL COMPONENT MADE BY THE METHOD

CROSS-REFERENCE TO RELATED APPLICATION

The present application claims the benefit of U.S. Provisional Application Ser. No. 62/822,048 filed on Mar. 22, 2019, which is hereby incorporated by reference herein and made a part of the specification.

BACKGROUND OF THE INVENTION

I. Field of the Invention

The invention relates to a method for forming an inductor, in particular for forming multiple inductors in a single process.

II. Description of the Related Art

Multifunctional portable electronic products and mobile communication products become smaller and require different voltage requirements for supporting LCD screens, wireless communication modules, baseband modules, and camera modules. As a result, the demand for conversion circuits and DC-DC converters has increased greatly, and the power inductors that affect the power conversion efficiency have also become very important.

The conventional power inductor is made by pressing filled magnetic powder with a coil wound around a bump or pillar, after which a lead frame is used for forming electrodes of the power inductor. However, the use of lead frames requires a large amount of space, which is not suitable as electrodes for smaller electrical components, such as the power inductor. In addition, due to the difference of the pressure between the bump and the filled magnetic powder, the coil is easily deformed after being heated and pressed, thereby causing particles of the magnetic powder to penetrate into the insulating layer of the coil, which can cause short circuits and increase resistance of the coil.

Accordingly, there is demand for a better solution to solve these problems.

SUMMARY OF THE INVENTION

One objective is to provide a method for forming a plurality of inductors in a single process to save cost and time for mass production.

One objective is to provide a method for forming a plurality of inductors in a single process, wherein coils of the inductors are fully encapsulated before applying pressure on the coils so as to avoid short circuits and the deformation of the coils.

One objective is to provide a method for forming a plurality of inductors in a single process, wherein a side surface of the conductive wire forming the coil is exposed from the magnetic body of the inductor so as to increase the contact area of the terminal part for forming an electrode of the inductor.

In one embodiment, an electrical component is disclosed, wherein the electrical component comprises: a magnetic body, comprising at least one magnetic powder; a conductive wire, wherein the conductive wire comprises a coil and a terminal part, wherein the terminal part is extended in a direction away from the axis of the coil and is entirely located at a same side of the axis of the coil, wherein a side surface of the terminal part of the conductive wire is exposed from a bottom surface of the magnetic body for forming an electrode of the electrical component.

In one embodiment, the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from the magnetic body.

In one embodiment, the axis of the terminal part of the conductive wire is substantially parallel or aligned to the bottom surface of the magnetic body.

In one embodiment, the electrical component is an inductor.

In one embodiment, said side surface of the terminal part of the conductive wire is substantially flat.

In one embodiment, further comprising a protection layer to encapsulate the magnetic body.

In one embodiment, the at least one magnetic powder comprises a first magnetic powder and a second magnetic powder, wherein the mean diameter of the first magnetic powder is larger than that of the second magnetic powder.

In one embodiment, an inductor is disclosed, wherein the inductor comprises: a magnetic body, comprising at least one magnetic powder; a conductive wire, wherein the conductive wire comprises a coil and a terminal part, wherein the terminal part is extended away from the axis of the coil and is entirely located at a same side of the axis of the coil, wherein a side surface of the terminal part of the conductive wire is exposed from a bottom surface of the magnetic body for forming an electrode of the inductor.

In one embodiment, the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from the magnetic body.

In one embodiment, said side surface of the terminal part of the conductive wire is substantially flat.

In one embodiment, a method to form an electrical component is disclosed, wherein the method comprises: providing a first magnetic sheet, wherein the first magnetic sheet comprises at least one magnetic powder; disposing a plurality of coils on the first magnetic sheet, wherein each coil is formed by a corresponding conductive wire; stacking at least one second magnetic layer over the first magnetic sheet for forming a magnetic body encapsulating the plurality of coils; and cutting the magnetic body into a plurality of pieces with each piece comprising a corresponding coil encapsulated by a corresponding portion of the magnetic body, wherein a side surface of the terminal part of the conductive wire forming the coil is exposed from said corresponding portion of the magnetic body for forming an electrode of the electrical component.

In one embodiment, a plurality of through openings are formed in the first magnetic sheet, wherein a terminal part of each conductive wire is disposed in a corresponding through opening of the first magnetic sheet.

In one embodiment, the second magnetic layer is printed on the first magnetic sheet.

In one embodiment, the second magnetic sheet comprising a plurality of through-holes, wherein the second magnetic sheet is disposed on the first magnetic sheet, wherein each coil is disposed in a corresponding through-hole of the second magnetic sheet;

In one embodiment, a third magnetic layer is disposed on the second magnetic sheet.

In one embodiment, wherein the at least one magnetic powder comprises a first magnetic powder and a second magnetic powder, wherein the mean diameter of the first magnetic powder is larger than that of the second magnetic powder.

In one embodiment, a method to form an electrical component is disclosed, wherein the method comprises: providing a first magnetic sheet, wherein the first magnetic sheet comprises at least one magnetic powder; disposing a plurality of coils on the first magnetic sheet, wherein each coil is formed by a corresponding conductive wire; stacking at least one second magnetic layer over the first magnetic sheet and applying pressure on said at least one second magnetic layer and the first magnetic sheet for forming a magnetic body encapsulating the plurality of coils, wherein the coils are fully encapsulated before applying the pressure on the at least one second magnetic layer and the first magnetic sheet; and cutting the magnetic body into a plurality of pieces with each piece comprising a corresponding coil encapsulated by a corresponding portion of the magnetic body.

In one embodiment, wherein the magnetic first sheet is in semi-cured state before pressing.

BRIEF DESCRIPTION OF THE DRAWINGS

The present invention can be more fully understood by reading the subsequent description and examples with references made to the accompanying drawings, wherein:

FIG. 2A shows a structure of a first magnetic sheet in accordance with an embodiment of the invention;

FIG. 2A-1 shows a unit of the structure of the first magnetic sheet in accordance with an embodiment of the invention;

FIG. 2B shows a structure of a second magnetic sheet in accordance with an embodiment of the invention;

FIG. 2B-1 shows a unit of the structure of the second magnetic sheet in accordance with an embodiment of the invention;

FIG. 2C shows a structure of a coil in accordance with an embodiment of the invention;

FIG. 2D-1 shows a unit of the structure in FIG. 2D in accordance with an embodiment of the invention;

DETAILED DESCRIPTION OF THE INVENTION

Figures 1, 2D:
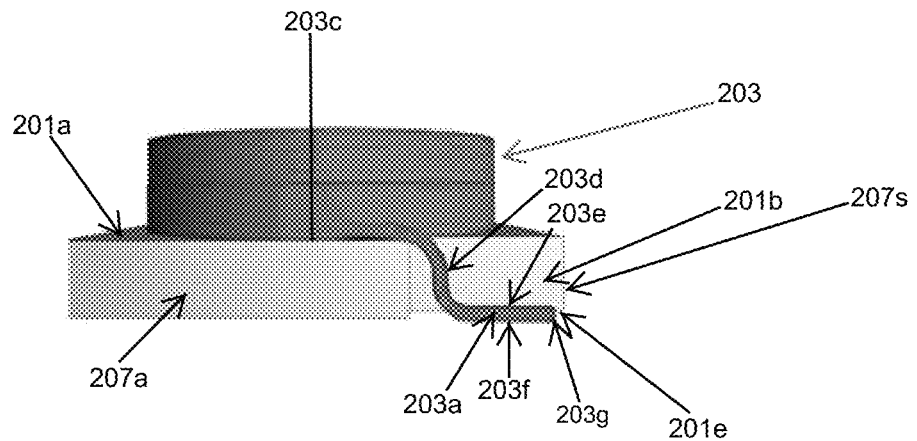
FIG. 1 illustrate a flow chart of a method to form an electrical component according to one embodiment of present invention.
FIG. 2D shows a structure of the first magnetic sheet with coils disposed thereon in accordance with an embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

In one embodiment of present invention, each of the magnetic sheets comprise two magnetic powders with different particle sizes, and the ratio: D50 of the larger magnetic powder to that of the smaller magnetic powder is 5:1~50~1, wherein, the smaller magnetic powder is added in an amount of 10~50 wt %. The magnetic powders and the adhesive material are pre-mixed with a mixer, and a magnetic sheet can be formed by a scraper forming method, after which a sheet of desired size is obtained by cutting.

The total number of winding turns and the type of the wire forming the coil are determined according to the inductance requirement of the coil. The terminal parts of the wire for connecting with external electrodes is designed to be substantially flat, and the side surface of the terminal part of the wire is used instead of the cross-section of the wire so as to increase the contact area with the outer electrode.

FIG. 1 illustrates a flow chart of a method to form an electrical component according to one embodiment of present invention, wherein the method comprises: step S101: providing a first magnetic sheet, wherein the first magnetic sheet comprises at least one magnetic powder; step S102: disposing a plurality of coils on the first magnetic sheet, wherein each coil is formed by a corresponding conductive wire; step S103: stacking at least one second magnetic layer over the first magnetic sheet for forming a magnetic body encapsulating the plurality of coils; and step S104: cutting the magnetic body into a plurality of pieces with each piece comprising a corresponding coil encapsulated by a corresponding portion of the magnetic body, wherein a side surface of the terminal part of the conductive wire forming the coil is exposed from said corresponding portion of the magnetic body for forming an electrode of the electrical component.

There are many ways to carry out the method, which will be described in below.

First Embodiment

Figure 2E:
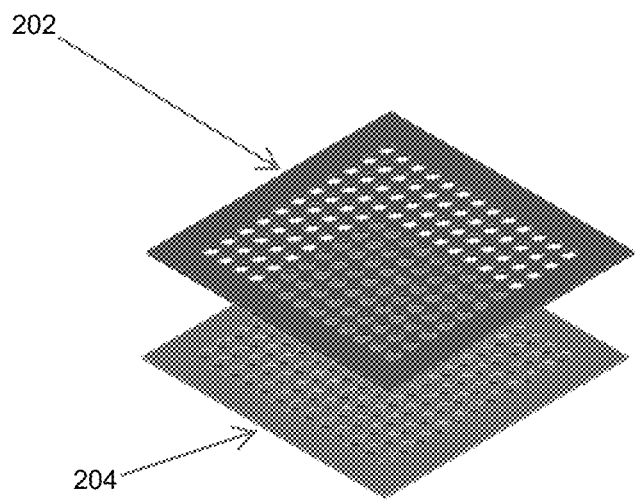
FIG. 2E shows the aligning of the first and the second magnetic sheets.
Figure 2F:
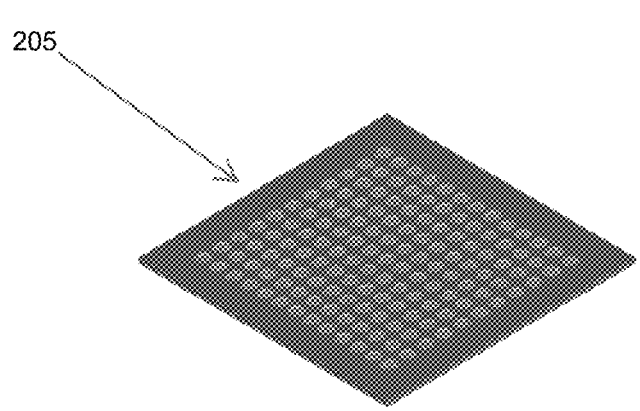
FIG. 2F shows a structure after the first and the second magnetic sheets are attached each other in accordance with an embodiment of the invention.
Figure 2H:
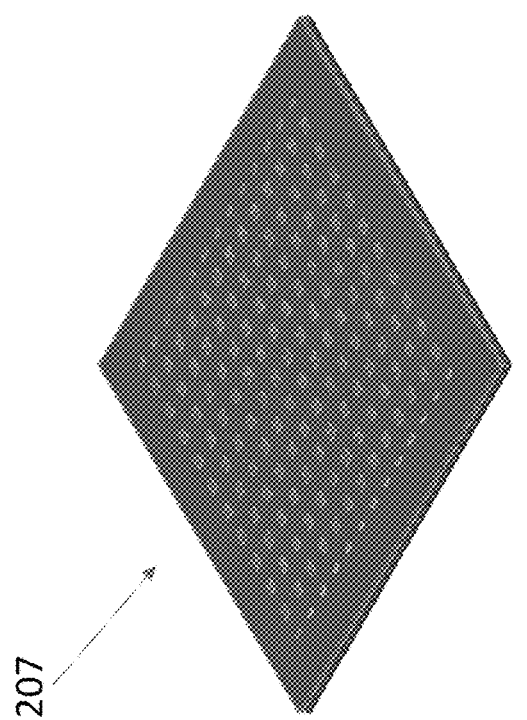
FIG. 2H shows a structure after heating and or pressing the structure in FIG. 2G in accordance with an embodiment of the invention.
Figure 2G:
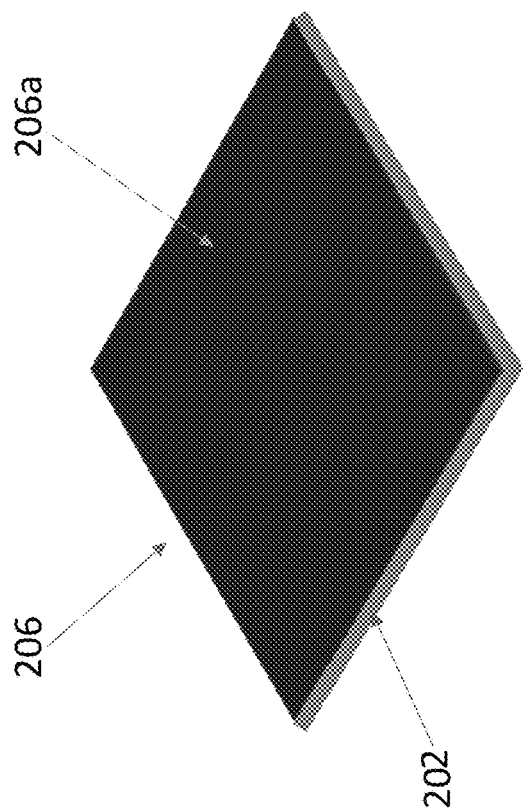
FIG. 2G shows a structure after printing an adhesive and magnetic material on the second magnetic sheet to encapsulate the coils in accordance with an embodiment of the invention.
Figure 2I:
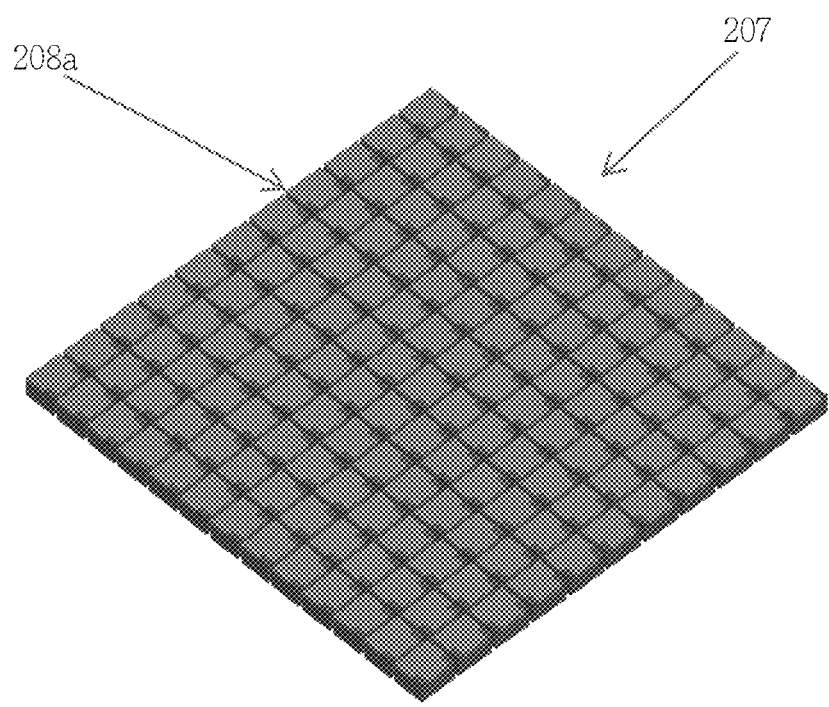
FIG. 2I shows a way to cut the structure in FIG. 2H along cutting lines in accordance with an embodiment of the invention.
Figure 2L:
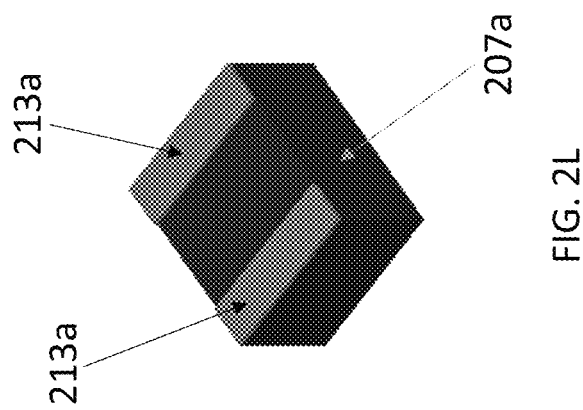
FIG. 2L shows a copper layer is overlaid on the terminal parts of the conductive wire after the internal conductors of the terminal parts are exposed in accordance with an embodiment of the invention.
Figure 2K:
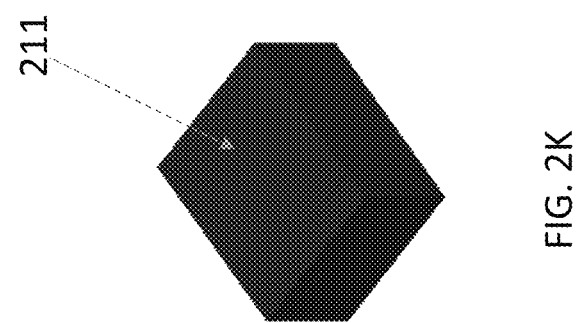
FIG. 2K shows a protecting layer is coated on the magnetic body in accordance with an embodiment of the invention.
Figure 2J:
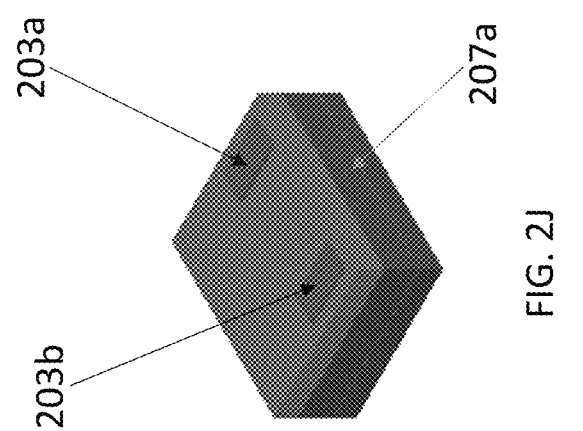
FIG. 2J shows a bottom view of the magnetic body of the inductor with two terminal parts of the conductive wire disposed on the bottom surface of the magnetic body in accordance with an embodiment of the invention.

Please refer to FIG. 2A-2J, a plurality of through openings 201b are formed in the first magnetic sheet 201 as shown in FIG. 2A, wherein the first magnetic sheet 201 comprises a plurality of protrusions 201c on a top surface 201a of the first magnetic sheet 201, such as bumps or pillars, wherein each unit 201u of the first magnetic sheet 201 is illustrated in FIG. 2A-1; then, a plurality of coils 203 are disposed on the first magnetic sheet 201 to form a structure 204 as shown in FIG. 2D, wherein each coil 203 is formed by a corresponding conductive wire as shown in FIG. 2C, wherein a terminal part 203a of each conductive wire is disposed in a corresponding through opening 201b of the first magnetic sheet 201, as shown in FIG. 2D-1; then, a second magnetic sheet 202 is disposed on the first magnetic sheet 201 to form a structure 205, wherein the second magnetic sheet 202 comprises a plurality of through-holes 202a, as shown in FIG. 2B, wherein each unit of the second magnetic sheet 202u is illustrated in FIG. 2B-1; wherein each coil 203 is disposed in a corresponding through-hole 202a of the second magnetic sheet 202 as illustrated in FIG. 2E for aligning the second magnetic sheet 202 with the first magnetic sheet 201, and FIG. 2F shows that the second magnetic sheet 202 is disposed on the first magnetic sheet 201 to form the structure 205; then, a magnetic and adhesive material 206a is printed onto the second magnetic sheet 202 to encapsulate the coils 203 so as to a form a structure 206, as shown in FIG. 2G; then, the structure 206 can be pressed and/or heated to become a magnetic body 207, as shown in FIG. 2H; then the magnetic body 207 can be cut into a plurality of pieces along a plurality of cutting line 208a, as shown in FIG. 2I, with each piece comprising a corresponding coil 203 encapsulated by a corresponding portion 207a of the magnetic body 207, as shown in FIG. 2J, wherein a side surface of the terminal part 203a, 203b, of the conductive wire forming the coil 203 is exposed from said corresponding portion of the magnetic body 207a for forming an electrode of the electrical component, as shown in FIG. 2J. In one embodiment, as shown in FIG. 2D-1, wherein the terminal part 203a is extended from a transition portion 203d of the conductive wire that is extended downwardly, wherein a contiguous portion of the conductive wire is composed of the transition portion 203d and the terminal part 203a, wherein the terminal part 203a is extended in a direction away from the axis 203c of the coil 203 and toward a lateral surface 207s of the magnetic body 207a with the entire terminal part 203a and the lateral surface 207s of the magnetic body 207a being located at a same side of the axis 203c of the coil 203 with a first side surface 203e of the terminal part 203a of the conductive wire being located higher than a bottom surface 201e of the magnetic body 207a, wherein a second side surface 203f of the terminal part 203a of the conductive wire is exposed from said bottom surface 201e of the magnetic body 207a for forming an electrode of the electrical component, wherein the first side surface 203e and the second side surface 203f are two opposite side surfaces of the terminal part 203a of the conductive wire, wherein the entire terminal part 203a that includes an endpoint 203g of the conductive wire is located between the axis 203c of the coil 203 and said lateral surface 207s of the magnetic body 207a.

FIG. 2J shows a bottom view of the magnetic body of the magnetic device, such as an inductor, with two terminal parts 203a, 203b of the conductive wire disposed on the bottom surface of the magnetic body 207a.

FIG. 2K shows a protection layer 211 can be coated on the magnetic body 207a.

FIG. 2L shows a copper layer 213a is overlaid on the terminal parts 203a, 203b of the conductive wire after the internal conductors of the terminal parts are exposed.

Figure 2M:
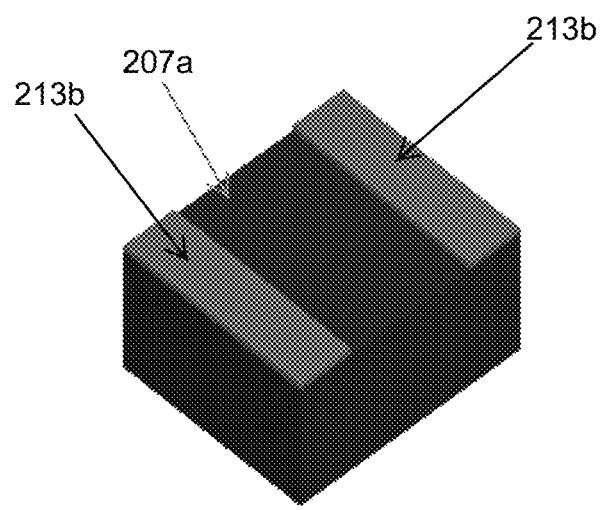
FIG. 2M shows a tin layer is overlaid on the copper layer in accordance with an embodiment of the invention.

FIG. 2M shows a tin layer 213b can be overlaid on the copper layer 213a.

Figure 2N:
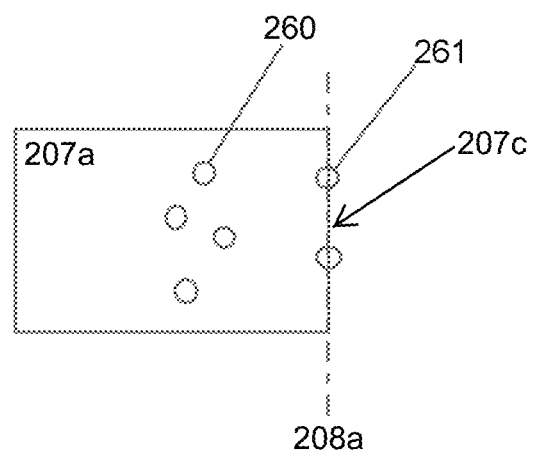
FIG. 2N shows the shapes of the particles of the magnetic powder inside the magnetic body in accordance with an embodiment of the invention.
Figure 2O:
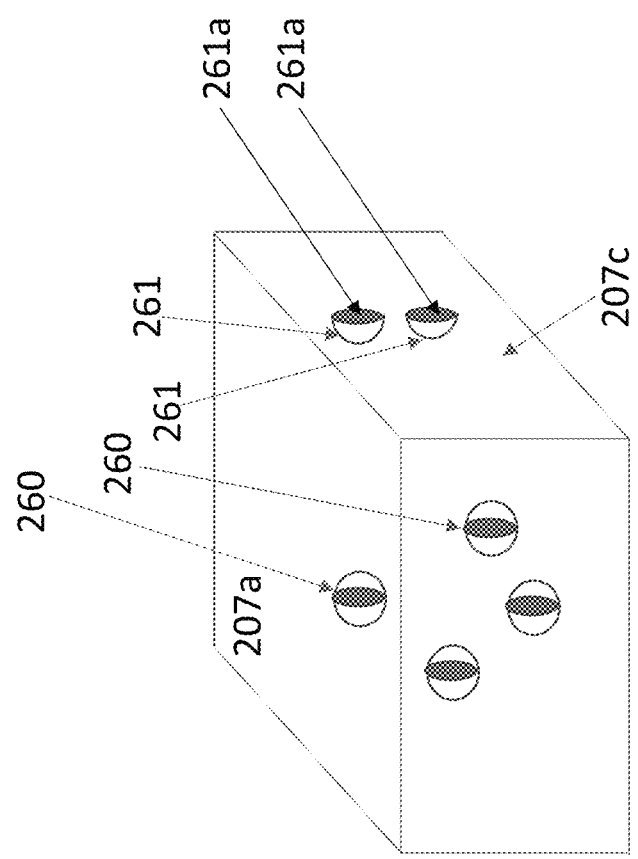
FIG. 2O shows a three-dimensional view of the particles of the magnetic powder inside the magnetic body corresponding to FIG. 2N.

FIG. 2N shows the shapes of the particles of the magnetic powder inside the magnetic body in accordance with an embodiment of the invention, wherein the at least one magnetic powder comprises a first plurality of particles 260 and a second plurality of particles 261, wherein each of the first plurality of particles 260 is entirely disposed inside the magnetic body 207a, and each of the second plurality of particles 261a is disposed in the magnetic body 207a with a substantially flat surface being exposed from the magnetic body after the magnetic body is cut along the cutting line 208a to form a lateral surface 207c. FIG. 2O shows a three-dimensional view of the particles of the magnetic powder inside the magnetic body 207a, wherein each of the first plurality of particles 260 is entirely disposed inside the magnetic body 207a, and each of the second plurality of particles 261 is disposed in the magnetic body 207a with a substantially flat surface 261a being exposed from the lateral surface 207c of the magnetic body 207a.

Second Embodiment

This embodiment is similar to the first embodiment described above, wherein instead of printing the magnetic and adhesive material 206a on the second magnetic sheet 202 to encapsulate the coils 203 as described in the first embodiment, another magnetic layer or sheet can be disposed on the on the second magnetic sheet 202 to encapsulate the coils 203. That is, in FIG. 2G, instead of using the magnetic and adhesive material 206a to encapsulate the coils 203 so as to a form a structure 206, the magnetic and adhesive material 206a will be changed to a magnetic layer that is disposed on the second magnetic sheet 202 to encapsulate the coils 203 so as to a form a structure 206. Other descriptions can be inferred from the first embodiment and therefore it will not be described further for this second embodiment.

Third Embodiment

Figure 3C:
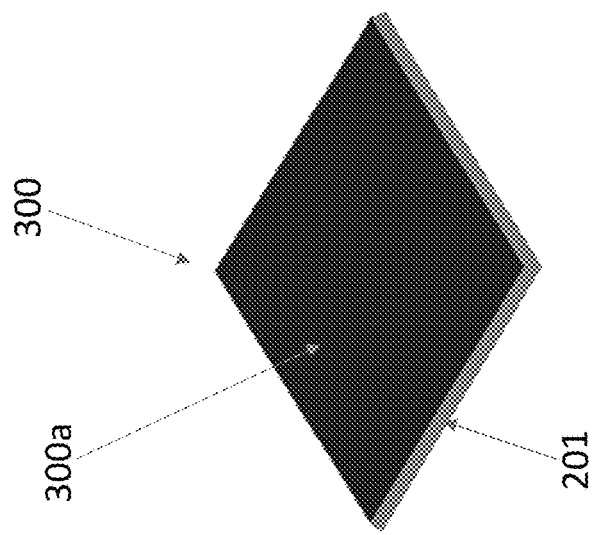
FIG. 3A-3E shows a process for making the inductor in accordance with one embodiment of the invention.
Figure 3B:
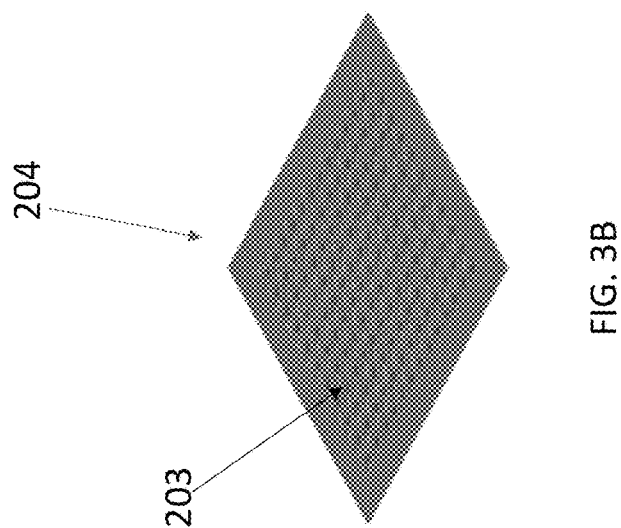
Figure 3A:
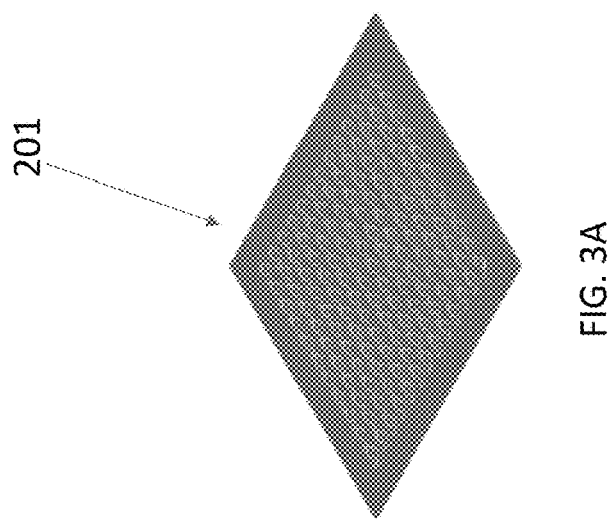
Figure 3D:
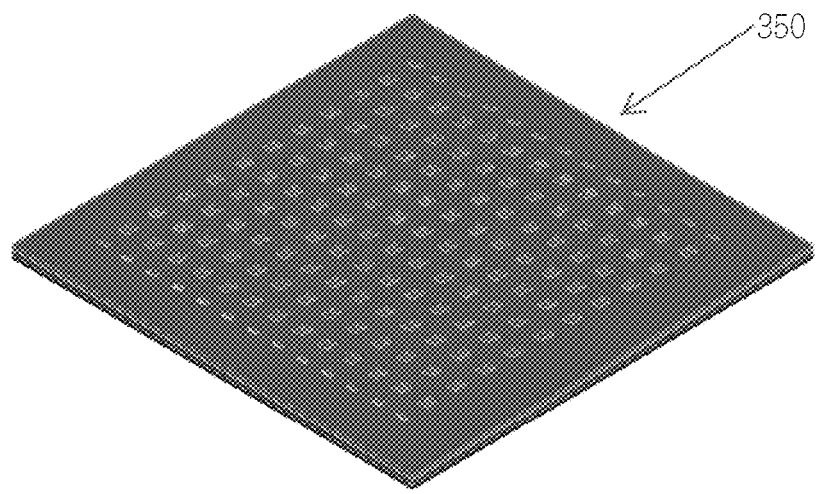
Figure 3E:
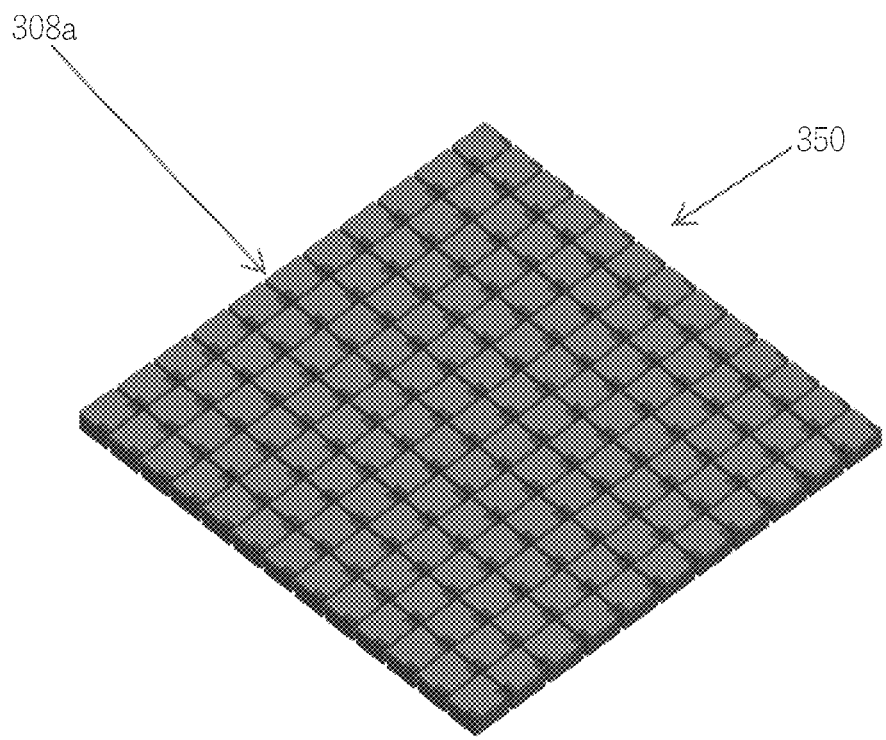

The first magnetic sheet 201, as shown in FIG. 2A, is provided here as shown in FIG. 3A (please refer to the first embodiment for the description of the first magnetic sheet 201); a plurality of coils 203 are disposed on the first magnetic sheet as shown in FIG. 3B; then, a magnetic and adhesive material 300a is printed on the first magnetic sheet 201 to encapsulate the coils 203 to from a structure 300, as shown in FIG. 3C; then, the structure 300 can be can be pressed and/or heated so as to form a magnetic body 350, as shown in FIG. 3D; then the magnetic body 350 can be cut into a plurality of pieces along a plurality of cutting line 308a, as shown in FIG. 3E, with each piece comprising a corresponding coil 203 encapsulated by a corresponding portion 207a of the magnetic body 207, as shown in FIG. 2J, wherein a side surface of the terminal part 203a, 203b of the conductive wire forming the coil 203 is exposed from said corresponding portion of the magnetic body 207a for forming an electrode of the electrical component, as shown in FIG. 2J.

Fourth Embodiment

Figure 4A:
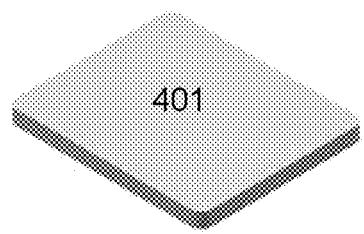
FIG. 4A-4G shows a process for making the inductor in accordance with one embodiment of the invention.
Figure 4B:
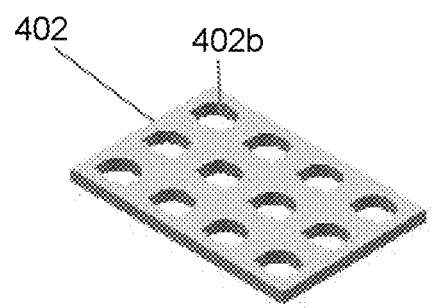
Figure 4C:
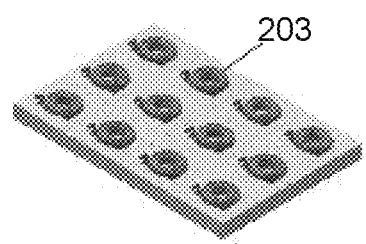
Figure 4D:
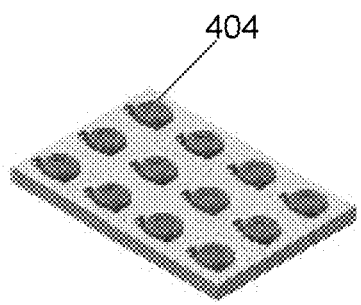
Figure 4E:
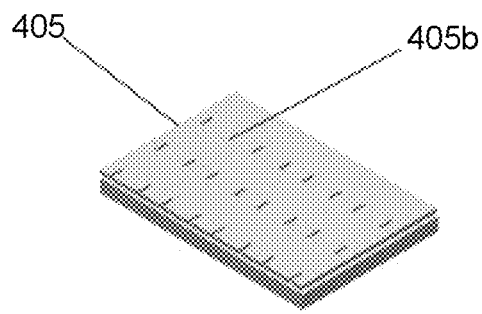
Figure 4F:
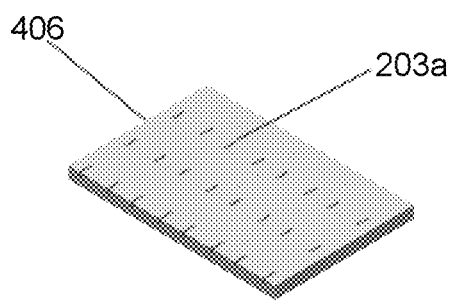
Figure 4G:
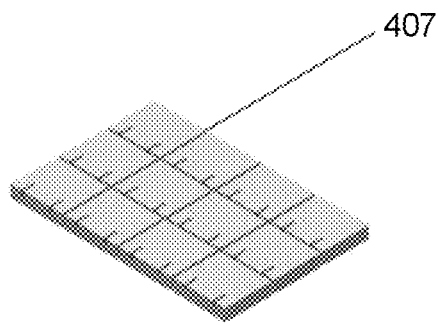

Please refer to FIG. 4A-4G, the first magnetic sheet 401 is formed as shown in FIG. 4A; then, a second magnetic sheet 402 is disposed on the first magnetic sheet, wherein the second magnetic sheet 402 comprises a plurality of through-holes 402b, as shown in FIG. 4B; then, a plurality of coils 203 are disposed on the first magnetic sheet 401, wherein each coil 203 is disposed in a corresponding through-hole 402b of the second magnetic sheet 402, as shown in FIG. 4C; then, a plurality of pillars 404 are disposed on the first magnetic sheet 401 and in a corresponding through-hole 402b of the second magnetic sheet 402, as shown in FIG. 4D; then, a third magnetic sheet 405 having a plurality of through-holes 405b is disposed on the second magnetic sheet 402 to encapsulate the coils 203 to form a structure, as shown in FIG. 4E; then, the structure in FIG. 4E can be pressed and/or heating for forming a magnetic body 406, wherein a terminal part 203a of the conductive wire forming the coil 203 is exposed form magnetic body 406 for forming an electrode, as shown in FIG. 4F; then the magnetic body 406 can be cut into a plurality of pieces with each piece along a plurality of cutting lines 407, each piece comprising a corresponding coil encapsulated by a corresponding portion of the magnetic body 406, wherein a side surface of the terminal part 203a of the conductive wire forming the coil is exposed from said corresponding portion of the magnetic body 406 for forming an electrode of the electrical component, as shown in FIG. 4G.

In one embodiment, the first magnetic sheet 401 and the second magnetic sheet 402 are integrally formed.

In one embodiment of the present invention, said magnetic sheets or magnetic layers can be in semi-cured state before pressing and/or heating said magnetic sheets; and then semi-cured magnetic sheets can be pressed and/or heated to form a solid magnetic body for subsequent cutting step.

In one embodiment of the present invention, the electrical component is an inductor, such as a choke.

In one embodiment of the present invention, the at least one magnetic powder comprises at least one first particle and at least one second particle, wherein each of the at least one first particle is disposed inside the magnetic body without having any portion being exposed from the magnetic body, and each of the at least one second particle is disposed in the magnetic body with a substantially flat surface being exposed from the magnetic body.

In one embodiment of the present invention, the first magnetic sheet comprising a first magnetic powder and a second magnetic powder, wherein the average diameter of the first magnetic powder is larger than that of the second magnetic powder.

In one embodiment of the present invention, each protrusion is a pillar.

In one embodiment of the present invention, each protrusion is a pillar and has a circular shape.

In one embodiment of the present invention, an electrical component is disclosed, wherein the electrical component comprises: a magnetic body, comprising at least one magnetic powder; a conductive wire, wherein the conductive wire comprises a coil and a terminal part, wherein the terminal part is extended away from the axis of the coil and is entirely located at a same side of the axis of the coil, wherein a side surface of the terminal part of the conductive wire is exposed from a bottom surface of the magnetic body for forming an electrode of the electrical component.

In one embodiment of the present invention, the at least one magnetic powder comprises a first magnetic powder and a second magnetic powder, wherein the mean diameter of the first magnetic powder is larger than that of the second magnetic powder.

In one embodiment of the present invention, the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from the magnetic body.

In one embodiment of the present invention, the axis of the terminal part of the conductive wire is substantially parallel or aligned to the bottom surface of the magnetic body.

In one embodiment of the present invention, said side surface of the terminal part of the conductive wire is substantially flat.

In one embodiment of the present invention, further comprising a protection layer to encapsulate the magnetic body.

In one embodiment, an inductor is disclosed, wherein the inductor comprises: a magnetic body, comprising at least one magnetic powder; a conductive wire, wherein the conductive wire comprises a coil and a terminal part, wherein the terminal part is extended away from the axis of the coil and is entirely located at a same side of the axis of the coil, wherein a side surface of the terminal part of the conductive wire is exposed from a bottom surface of the magnetic body for forming an electrode of the inductor.

In one embodiment, the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from the magnetic body.

In one embodiment, said side surface of the terminal part of the conductive wire is substantially flat.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electrical component, comprising:
 a magnetic body, comprising at least one magnetic powder;
 a conductive wire, wherein the conductive wire comprises a coil and a terminal part, wherein the coil is disposed in the magnetic body, and the terminal part is extended from a transition portion of the conductive wire that is extended downwardly, wherein a contiguous portion of the conductive wire is composed of the transition portion and the terminal part, wherein the terminal part is extended in a direction away from an axis of the coil and toward a lateral surface of the magnetic body, wherein the entire terminal part and the lateral surface of the magnetic body are located at a same side of the axis of the coil with a first side surface of the terminal part of the conductive wire being located higher than a bottom surface of the magnetic body, wherein a second side surface of the terminal part of the conductive wire is exposed from said bottom surface of the magnetic body for forming an electrode of the electrical component thereon, wherein the first side surface and the second side surface are two opposite side surfaces of the terminal part of the conductive wire, wherein the entire terminal part that includes an endpoint of the conductive wire is located between the axis of the coil and said lateral surface of the magnetic body, wherein said endpoint of the conductive wire disposed on the bottom surface of the magnetic body and said transition portion of said contiguous portion of the conductive wire are located at a same side of the axis of the coil.

2. The electrical component according to claim 1, wherein the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from a lateral surface of the magnetic body.

3. The electrical component according to claim 2, wherein an axis of the terminal part of the conductive wire is substantially parallel or aligned to the bottom surface of the magnetic body.

4. The electrical component according to claim 1, wherein the electrical component is an inductor, wherein the transition portion extends downwardly and connects the coil to the terminal part, wherein there is no straight line that penetrates the entire transition portion along a vertical direction.

5. The electrical component according to claim 2, wherein said second side surface of the terminal part of the conductive wire is substantially flat.

6. The electrical component according to claim 1, wherein the at least one magnetic powder comprises a first magnetic powder and a second magnetic powder, wherein the mean diameter of the first magnetic powder is larger than that of the second magnetic powder.

7. An inductor, comprising:
a magnetic body, comprising at least one magnetic powder;
a conductive wire, wherein the conductive wire comprises a coil and a terminal part, wherein the coil is disposed in the magnetic body, and the at least one magnetic powder comprises a first plurality of particles and a second plurality of particles, wherein each of the first plurality of particles is entirely disposed inside the magnetic body, and each of the second plurality of particles is disposed in the magnetic body with a substantially flat surface being exposed from a lateral surface of the magnetic body, wherein the terminal part is extended from a transition portion of the conductive wire that is extended downwardly, wherein a contiguous portion of the conductive wire is composed of the transition portion and the terminal part, wherein the terminal part is extended in a direction away from an axis of the coil and toward a lateral surface of the magnetic body, wherein the entire terminal part and the lateral surface of the magnetic body are located at a same side of the axis of the coil with a first side surface of the terminal part of the conductive wire being located higher than a bottom surface of the magnetic body, wherein a second side surface of the terminal part of the conductive wire is exposed from said bottom surface of the magnetic body for forming an electrode of the electrical component thereon, wherein the first side surface and the second side surface are two opposite side surfaces of the terminal part of the conductive wire, wherein the entire terminal part that includes an endpoint of the conductive wire is located between the axis of the coil and said lateral surface of the magnetic body, wherein said endpoint of the conductive wire disposed on the bottom surface of the magnetic body and said transition portion of said contiguous portion of the conductive wire are located at a same side of the axis of the coil.

8. The inductor according to claim 7, wherein an axis of the terminal part of the conductive wire is substantially parallel or aligned to the bottom surface of the magnetic body.

9. The inductor according to claim 7, wherein the second side surface of the terminal part of the conductive wire is substantially flat.

10. The inductor according to claim 7, wherein the at least one magnetic powder comprises a first magnetic powder and a second magnetic powder, wherein the mean diameter of the first magnetic powder is larger than that of the second magnetic powder.

11. The inductor according to claim 7, wherein the transition portion extends downwardly and connects the coil to the terminal part, wherein there is no straight line that penetrates the entire transition portion along a vertical direction.

* * * * *